United States Patent
Kim et al.

(10) Patent No.: US 9,041,212 B2
(45) Date of Patent: May 26, 2015

(54) THERMAL DESIGN AND ELECTRICAL ROUTING FOR MULTIPLE STACKED PACKAGES USING THROUGH VIA INSERT (TVI)

(71) Applicant: QUALCOMM Incorporated, San Diego, CA (US)

(72) Inventors: Dong Wook Kim, San Diego, CA (US); Victor Adrian Chiriac, San Diego, CA (US); Kyu-Pyung Hwang, San Diego, CA (US); Changhan Hobie Yun, San Diego, CA (US); Young Kyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 13/787,476

(22) Filed: Mar. 6, 2013

(65) Prior Publication Data

US 2014/0252645 A1   Sep. 11, 2014

(51) Int. Cl.
*H01L 23/48* (2006.01)
*H01L 23/34* (2006.01)
*H01L 23/367* (2006.01)
*H01L 23/538* (2006.01)
*H01L 25/065* (2006.01)

(52) U.S. Cl.
CPC .............. *H01L 23/34* (2013.01); *H01L 23/367* (2013.01); *H01L 23/3677* (2013.01); *H01L 23/5384* (2013.01); *H01L 23/5385* (2013.01); *H01L 23/5389* (2013.01); *H01L 25/0652* (2013.01); *H01L 2224/16* (2013.01); *H01L 2924/0002* (2013.01); *H01L 2924/15311* (2013.01)

(58) Field of Classification Search
CPC ........... H01L 2225/06541; H01L 2224/02372; H01L 2224/32146; H01L 23/055; H01L 23/5385; H01L 23/5384; H01L 25/0652
USPC .................. 438/107, 108; 257/774, 777, 778
See application file for complete search history.

(56) References Cited

U.S. PATENT DOCUMENTS

| | | | |
|---|---|---|---|
| 6,627,978 B2 | 9/2003 | Dujari et al. | |
| 2007/0267740 A1 | 11/2007 | Khan et al. | |
| 2007/0267746 A1 | 11/2007 | Bernstein et al. | |
| 2010/0213600 A1* | 8/2010 | Lau et al. | ....................... 257/693 |
| 2011/0175213 A1 | 7/2011 | Mori et al. | |
| 2011/0256664 A1* | 10/2011 | Pagaila et al. | ................. 438/108 |
| 2012/0032340 A1 | 2/2012 | Choi et al. | |

\* cited by examiner

*Primary Examiner* — Brook Kebede
(74) *Attorney, Agent, or Firm* — Loza & Loza, LLP

(57) ABSTRACT

Some implementations provide a semiconductor package structure that includes a package substrate, a first package, an interposer coupled to the first package, and a first set of through via insert (TVI). The first set of TVI is coupled to the interposer and the package substrate. The first set of TVI is configured to provide heat dissipation from the first package. In some implementations, the semiconductor package structure further includes a heat spreader coupled to the interposer. The heat spreader is configured to dissipate heat from the first package. In some implementations, the first set of TVI is further configured to provide an electrical path between the first package and the package substrate. In some implementations, the first package is electrically coupled to the package substrate through the interposer and the first set of TVI. In some implementations, the first set of TVI includes a dielectric layer and a metal layer.

27 Claims, 12 Drawing Sheets

①

②

③

THERMAL DESIGN AND ELECTRICAL ROUTING FOR MULTIPLE STACKED PACKAGES USING THROUGH VIA INSERT (TVI)

BACKGROUND

1. Field

Various features relate to thermal design and electrical routing for multiple stacked packages using through via insert (TVI).

2. Background

Current package structures that include multiple die packages with stacked dice usually provide a heat spreader that is coupled to the top portion of the die package. FIG. 1 illustrates an example of a package structure with such a design. As shown in FIG. 1, the package structure 100 includes a first package substrate 102, a first package 104, a second package 106, a heat spreader 108, a second substrate 110 and a set of solder balls 111. The first package 104 includes a first die 112 and a second die 114. The second package 106 includes a third die 116, a fourth die 118, a fifth die 120, and a sixth die 122.

As shown in FIG. 1, the first package 104 is coupled and positioned above (e.g., on top of) the package substrate 102. More specifically, the first package 104 is positioned above the second substrate 110, which is positioned above the package substrate 102. Similarly, the second package 106 is coupled and positioned above (e.g., on top of) the package substrate 102. Both the first package 104 and the second package 106 are electrically coupled to the package substrate 102 through the second substrate 110 and the solder balls 111.

In order for the heat spreader 108 to effectively dissipate heat from the first package 104 and the second package 106, both the first package 104 and the second package 106 must be in physical contact with the heat spreader 108. As shown in FIG. 1, the first package 104 has a different height than the second package 106. Thus, in order for both packages 104-106 to be in physical contract with the heat spreader 108, a filler is used. Specifically, a first filler 124 is used to couple the first package 104 with the heat spreader 108. The first filler 124 may be part of the first package 104. Similarly, a second filler 126 is used to couple the second package 106 with the heat spreader 108. The second filler 126 may be part of the second package 106. In the design and configuration shown in FIG. 1, heat that is generated by the first package 104 may dissipate through the first filler 124 and the heat spreader 108. Similarly, heat that is generated by the second package 106 may dissipate through the second filler 126 and the heat spreader 108.

One drawback of the above design is that it adds thickness to the package structure 100. In addition, the use of the filler adds cost to the design and manufacturing of the package structure 100. Moreover, the above design does not dissipate heat efficiently. Therefore, there is a need for an improved thermal design for package structures.

SUMMARY

Various features relate to thermal design and electrical routing for multiple stacked packages using through via insert (TVI).

A first example provides a semiconductor package structure that includes a package substrate, a first package, an interposer coupled to the first package, and a first set of through via insert (TVI). The first set of TVI is coupled to the interposer and the package substrate. The first set of TVI is configured to provide heat dissipation from the first package.

According to an aspect, the semiconductor package structure further includes a heat spreader coupled to the interposer. The heat spreader is configured to dissipate heat from the first package. In some implementations, the first set of TVI is further configured to provide an electrical path between the first package and the package substrate. In some implementations, the first package is electrically coupled to the package substrate through the interposer and the first set of TVI.

According to one aspect, the first set of TVI includes a first dielectric layer and a first metal layer. The first metal layer may be one or more traces on the first dielectric layer. In some implementations, the first set of TVI is a laminate structure.

According to an aspect, the semiconductor package structure further includes a second package, and a second set of through via insert (TVI). The second set of TVI is coupled to the interposer and the package substrate. The second set of TVI is configured to provide heat dissipation from the second package. In some implementations, the second set of TVI is further configured to provide an electrical path between the second package and the package substrate. In some implementations, the interposer includes a first set of traces and a second set of traces. The first set of traces is coupled to the first package and the first set of TVI. The second set of traces is coupled to the second package and the second set of TVI.

A second example provides an apparatus that includes a package substrate, a first package and an interposer coupled to the first package. The apparatus also includes a first interconnect means for coupling the interposer and the package substrate. The first interconnect means configured to provide heat dissipation from the first package.

According to an aspect, the apparatus also includes a heat dissipating means configured to dissipate heat from the first package. The heat dissipating means coupled to the first interconnect means.

According to one aspect, the first interconnect means is further configured to provide an electrical path between the first package and the package substrate.

According to an aspect, the first package is electrically coupled to the package substrate through the interposer and the first interconnect means.

According to one aspect, the first interconnect means includes a first dielectric layer and a first metal layer. In some implementations, the first interconnect means is a laminate structure.

According to an aspect, the apparatus also includes a second package, and a second interconnect means for coupling the interposer and the package substrate. The second interconnect means is configured to provide heat dissipation from the second package. In some implementations, the second interconnect means is further configured to provide an electrical path between the second package and the package substrate. In some implementations, the interposer includes a first set of traces and a second set of traces. The first set of traces is coupled to the first package and the first interconnect means. The second set of traces is coupled to the second package and the second interconnect means.

According to one aspect, the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

A third example provides a method for providing a semiconductor package structure. The method provides a package substrate. The method provides a first set of through via insert (TVI) on the package substrate. The method couples a first package to an interposer. The method couples the interposer to the first set of TVI such that the first set of TVI is coupled to the interposer and the package substrate. The first set of TVI is configured to provide heat dissipation from the first package.

According to an aspect, the method further couples a heat spreader to the interposer. The heat spreader is configured to dissipate heat from the first package.

According to one aspect, the first set of TVI is further configured to provide an electrical path between the first package and the package substrate.

According to an aspect, the first package is electrically coupled to the package substrate through the interposer and the first set of TVI. In some implementations, the first set of TVI includes a first dielectric layer and a first metal layer. In some implementations, the first set of TVI is a laminate structure.

According to one aspect, the method further provides a second set of through via insert (TVI) on the package substrate. The method also couples a second package to the interposer. The method couples the interposer to the second set of TVI such that the second set of TVI is coupled to the interposer and the package substrate. The second set of TVI is configured to provide heat dissipation from the second package. In some implementations, the second set of TVI is further configured to provide an electrical path between the second package and the package substrate. In some implementations, the interposer includes a first set of traces and a second set of traces. The first set of traces is coupled to the first package and the first set of TVI. The second set of traces is coupled to the second package and the second set of TVI.

According to one aspect, the method further incorporates the semiconductor package structure into at least one of a music player, a video player, an entertainment unit, a navigation device, a communications device, a mobile phone, a smartphone, a personal digital assistant, a fixed location terminal, a tablet computer, and/or a laptop computer.

DRAWINGS

Various features, nature and advantages may become apparent from the detailed description set forth below when taken in conjunction with the drawings in which like reference characters identify correspondingly throughout.

DETAILED DESCRIPTION

In the following description, specific details are given to provide a thorough understanding of the various aspects of the disclosure. However, it will be understood by one of ordinary skill in the art that the aspects may be practiced without these specific details. For example, circuits may be shown in block diagrams in order to avoid obscuring the aspects in unnecessary detail. In other instances, well-known circuits, structures and techniques may not be shown in detail in order not to obscure the aspects of the disclosure.

Overview

Several novel features pertain to a semiconductor package structure that includes a package substrate, a first package, an interposer coupled to the first package, and a first set of through via insert (TVI). The first set of TVI is coupled to the interposer and the package substrate. The first set of TVI is configured to provide heat dissipation from the first package. In some implementations, the semiconductor package structure further includes a heat spreader coupled to the interposer. The heat spreader is configured to dissipate heat from the first package. In some implementations, the first set of TVI is further configured to provide an electrical path between the first package and the package substrate. In some implementations, the first package is electrically coupled to the package substrate through the interposer and the first set of TVI. In some implementations, the first set of TVI includes a first dielectric layer and a first metal layer. The first metal layer may be one or more traces on the first dielectric layer. In some implementations, the first set of TVI is a laminate structure. In some implementations, the semiconductor package structure further includes a second package, and a second set of through via insert (TVI). The second set of TVI is coupled to the interposer and the package substrate. The second set of TVI is configured to provide heat dissipation from the second package. In some implementations, the second set of TVI is further configured to provide an electrical path between the second package and the package substrate. In some implementations, the interposer includes a first set of traces and a second set of traces. The first set of traces is coupled to the first package and the first set of TVI. The second set of traces is coupled to the second package and the second set of TVI.

Exemplary Package Structure With Through Via Inserts (TVIs)

Figure 1:
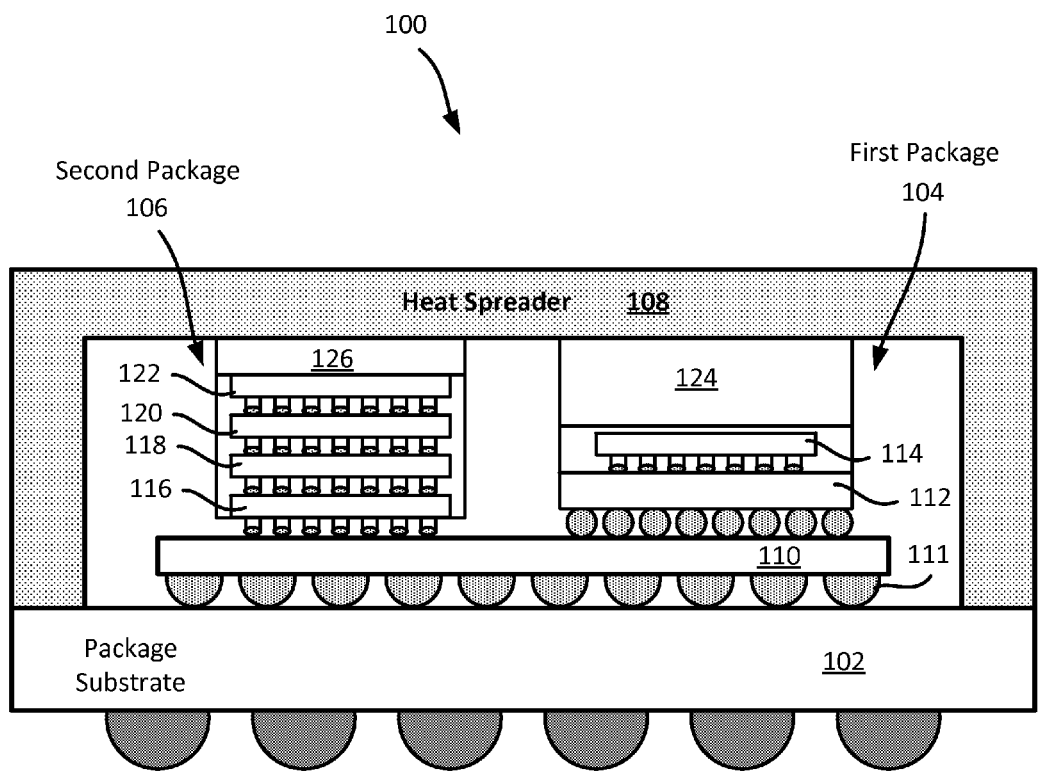
FIG. 1 illustrates a conventional package structure.
Figure 2:
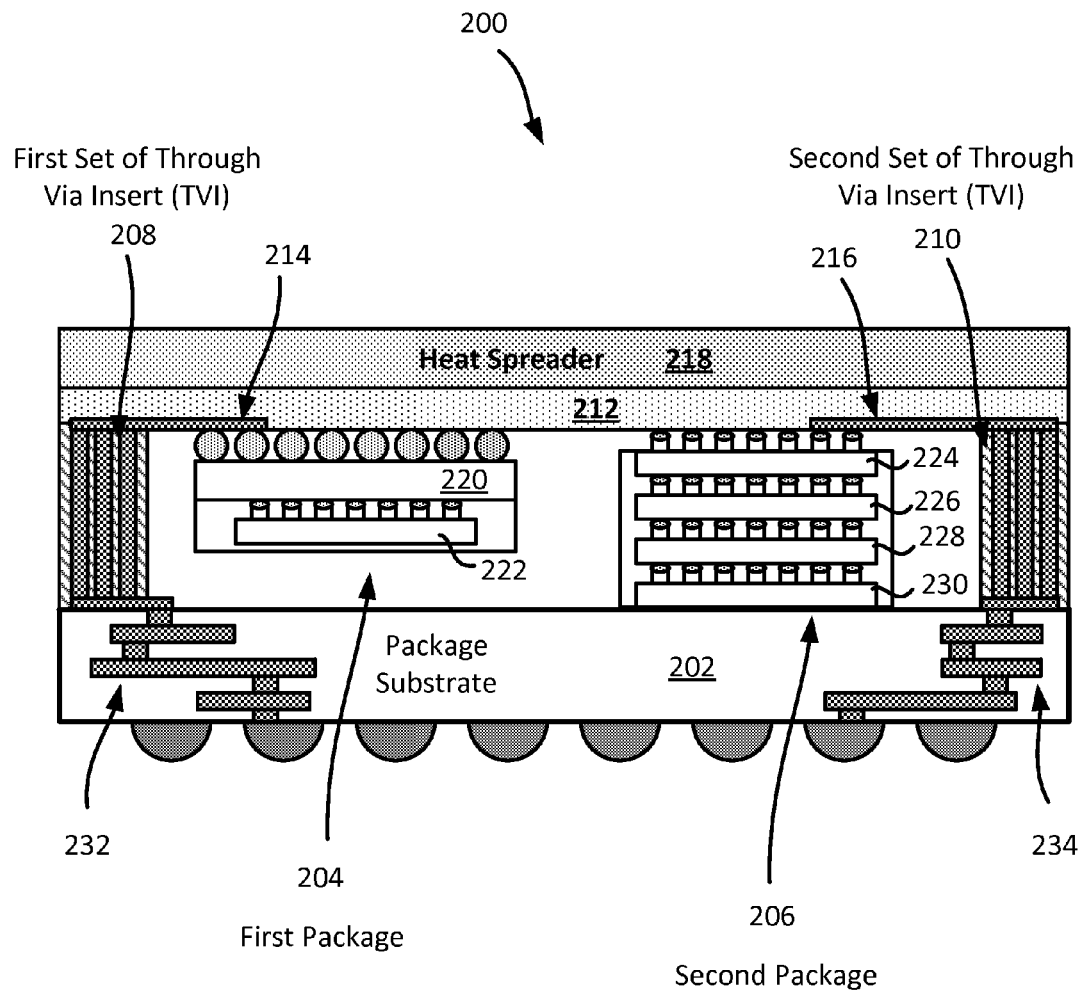
FIG. 2 illustrates a package structure with a through via insert (TVI).

FIG. 2 illustrates an exemplary package structure with enhanced/improved thermal design properties. Specifically, FIG. 2 illustrates a package structure 200 that includes a package substrate 202, a first package 204, a second package 206, a first set of through via insert (TVI) 208, a second set of through via insert (TVI) 210, an interposer 212, a first set of traces 214, a second set of traces 216, and a heat spreader 218. In some implementations, the combination/arrangement of the interposer 212, the first package 204, and the second package 206 may be referred to as a multi-chip module (MCM). The first package 204 may be a System-in-Package (SiP). The first package 204 includes a first die 220 and a second die 222. The second package 206 may be a System-in-Package (SiP). The second package 206 includes a third die 224, a fourth die 226, a fifth die 228, and sixth die 230. In some implementations, the first package 204 and the second package 206 are inverted packages. The term "inverted package" will be further described below.

As shown in FIG. 2, the first set of TVI 208 and the second set of TVI 210 are coupled to the package substrate 202. In some implementations, the first set of TVI 208 and the second set of TVI 210 are coupled to the package substrate 202 through solder (which is not shown). More specifically, the first set of TVI 208 and the second set of TVI 210 are coupled to traces on the package substrate 202. The first set of TVI 208 and the second set of TVI 210 include several components. The components of the TVIs 208-210 will be further described in detail in FIG. 3.

The interposer 212 includes the first set of traces 214 and the second set of traces 216. The first set of TVI 208 is coupled to the first set of traces 214, which is coupled to the first package 204. In some implementations, the first set of TVI 208 is coupled to the first set of traces 214 through solder (which is not shown). The first package 204 is coupled to the interposer 212. The interposer 212 is configured to provide structural support for the first package 204 in the package structure 200. The interposer 212 is also configured to provide a path for heat to dissipate away from the first package 204. In some implementations, heat from the first package 204 may dissipate from the first package 204 to the interposer 212, the heat spreader 218, the first set of traces 214 and/or the first set of TVI 208. In some implementations, the interposer 212 includes a material with a high thermal conductivity value (e.g., metal). For example, the interposer may include a copper material (e.g., vias, traces, and/or interconnects in the interposer may be a copper material). The interposer 212 may also include one or more dielectric layers and vias (both not shown). In some implementations, the traces 214-216 (which may be made of copper) may be located in between the dielectric layers (not shown) of the interposer 212. In some implementations, the traces 214-216 maybe be coupled to the first and second packages 204-206 through vias in the interposer 212. In some implementations, the interposer 212 and the heat spreader 218 may be combined.

In the design/configuration shown in FIG. 2, the first package 204 is electrically coupled to the package substrate 202 through the first set of traces 214 and the first set of TVI 208. That is, power and signal lines traverse between the first package 204 and the package substrate 202 through the first set of TVI 208 and the first set of traces 214. Thus, one advantage of using the TVI 208 is that the TVI 208 provides at least two important functionalities/capabilities. One, the TVI 208 may be configured to provide heat dissipation functionality for the first package 204. Two, the TVI 208 may be configured to provide electrical coupling and/or electrical path functionality (e.g., for power and/or signal lines) between the first package 204 and the package substrate 202. In some implementations, the heat dissipation functionality of the TVI 208 allows the first package 204 to operate at a lower temperature, which may subsequently result in better operational performance of the first package 204. A more detailed description of an exemplary TVI will be further described in FIG. 3.

The second set of TVI 210 is coupled to the second set of traces 216, which is coupled to the second package 206. In some implementations, the second set of TVI 210 is coupled to the second set of traces 216 through solder (which is not shown). The second package 206 is electrically coupled to the package substrate 202 through the second set of traces 216 and the second set of TVI 210. That is, power and signal lines traverse between the second package 206 and the package substrate 202 through the second set of TVI 210 and the second set of traces 216. Thus, just like the first set of TVI 208, one advantage of using one or more TVI with the second package 206 is that it provides at least two important functionalities/capabilities. One, the TVI 210 may be configured to provide heat dissipation functionality for the second package 206. Two, the TVI 210 may be configured to provide electrical coupling and/or electrical path functionality (e.g., for power and/or signal lines) between the second package 206 and the package substrate 202. In some implementations, the heat dissipation functionality of the TVI 210 allows the second package 206 to operate at a lower temperature, which may subsequently result in better operational performance of the second package 206. A more detailed description of an exemplary TVI will be further described in FIG. 3.

As mentioned above, in some implementations, the first package 204 and the second package 206 may be inverted packages. The term "inverted package" is herein referred to as a package whose top side portion (e.g., portion of package opposite of portion with solder bump, underbump metallization (UBM)) is facing the package substrate of the package structure. In some implementations, the term "inverted package" is herein referred to as a package/device that is coupled (e.g., electrically coupled) to the heat spreader and/or interposer side.

In the example of FIG. 2, the first package 204 and the second package 206 are physically coupled to a component (in this case the interposer 212) of the package structure 200 that is on the opposite side of the package substrate 202. That is, each package (e.g., first package 204, second package 206) is between the package substrate 202 and the interposer 212, but is physically coupled (e.g., bonded) to the interposer 212 instead of the package substrate 202. In some implementations, the packages (e.g., first package 204, second package 206) may also be physically coupled to the package substrate 202, but are electrically coupled to the interposer 212 directly. In such instances, the packages may still be electrically coupled to the package substrate 202 indirectly (e.g., through the interposer 212 and TVIs). In some implementations, packages that are not inverted may be used. In such instances, the packages may have the same height.

FIG. 2 also illustrates that the package substrate includes a first set of interconnects 232 and a second set of interconnects 234. The first set of interconnects 232 includes a set of first vias, a set of first interconnects and a set of first traces in some implementations. The second set of interconnects 234 includes a set of second vias, a set of second interconnects and a set of second traces in some implementations. In some implementations, the first set of interconnects 232 is coupled to the first set of TVI 208. In some implementations, the second set of interconnects 234 is coupled to the second set of TVI 210. In some implementations, power and signals may travel through the first and second sets of interconnects 232-234. In some implementations, the first set of interconnects 232, the first set of TVI 208, and the first set of traces 214 define a first power delivery network for the first package 204. In some implementations, the second set interconnects 234, the second set of TVI 210, and the second set of traces 216 define a second power delivery network for the second package 206. In some implementations, the first and second power delivery networks provide a heat path for dissipating heat away from the first and/or second packages 204-206.

One benefit of the package structure design and configuration shown in FIG. 2 is that it eliminates the need for a filler in the package structure. As shown in FIG. 2, even though the first inverted package 204 is shorter than the second inverted package 206, a filler is not necessary. Although in some implementations, a filler may be added nonetheless to the first inverted package 204 to provide additional structural support of the first inverted package 204 in the package structure 200. Similarly, a filler may also be added to the second inverted package 206 to provide additional structural support of the second inverted package 206 in the package structure 200. An example of packages with filler in a package structure using TVI is further described in FIG. 7.

Another benefit of the package structure 200 is that it provides better heat dissipation (e.g., more efficient heat dissipation) than prior package structures by providing additional conductive paths for heat to dissipate away from the die packages. In some implementations, the TVIs allow heat to dissipate from multiple directions of the package structure 200. For example, the TVIs may be configured to allow heat (e.g., heat from the first and/or second packages) to dissipate from the side of the package structure 200 and/or package substrate 202. In some implementations, heat from the first and/or second packages of the package structure 200 may dissipate from the interposer, the heat spreader, the TVIs, and/or the package substrate (e.g., through traces, interconnects, vias in the package substrate 202).

Having described a package structure that includes through via inserts (TVIs), a more detailed description of TVIs will now be described below.

Exemplary Through Via Insert (TVI)

Figure 3:
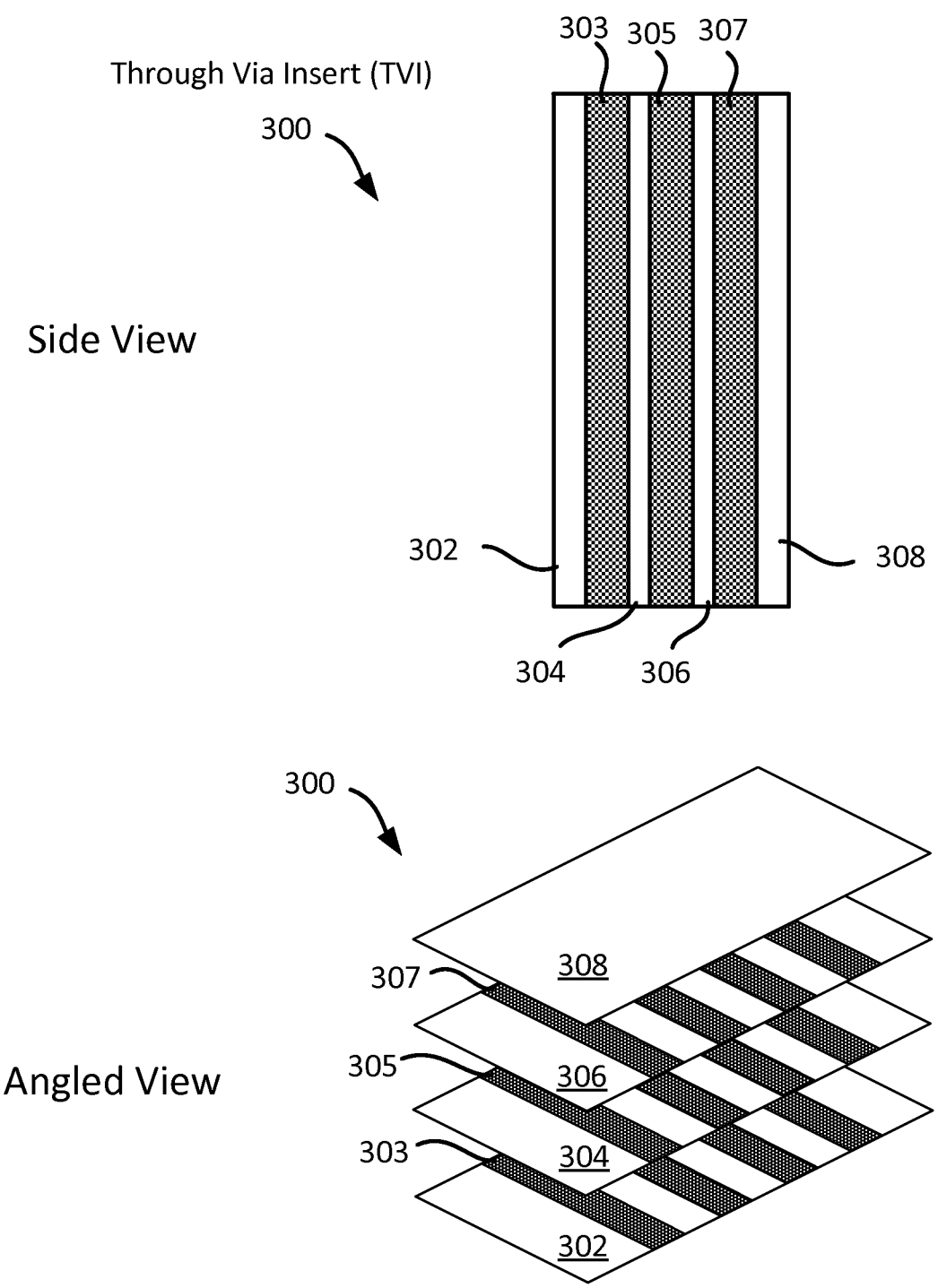
FIG. 3 illustrates an example of a through via insert (TVI).

FIG. 3 illustrates an example of a through via insert (TVI). Specifically, FIG. 3 illustrates a side view a TVI 300 and an angled view of components of the TVI 300. The angled view of the components of the TVI 300 is an unassembled view of the components of the TVI 300. In some implementations, the TVI 300 is the first set of TVI 208 and/or the second set of TVI 210 of FIG. 2.

As shown in FIG. 3, the TVI 300 includes a first layer 302, a second layer 304, a fourth layer 306 and a fourth layer 308. In some implementations, the first, second, third and fourth layers 302, 304, 306 and 308 are dielectric layers. FIG. 3 also illustrates that the TVI 300 includes a first metal layer 303, a second metal layer 305 and a third metal layer 307. In some implementations, the first, second and third metal layers 303, 305 and 307 are copper layers. The metal layers (e.g., 303, 305, 307) may represent one or more traces on their respective dielectric layers (e.g., dielectric layers 302, 304, 306, respectively) in some implementations.

The combination of a dielectric layer and a metal layer may be referred to as a panel and/or panel layer in some implementations. For example, the combination of the first layer 302 and first metal 303 may be a first panel/panel layer, the combination of the second layer 304 and second metal 305 may be a second panel/panel layer, and the combination of the third layer 306 and first metal 307, may be a third panel/panel layer. The fourth layer 308 may be a fourth panel/panel layer in some implementations. In some implementations, a structure comprising one or more combination of panels and/or panel layers (e.g., a dielectric layer and metal layer) is referred to as a laminate structure or laminated structure (e.g., TVI).

The number of dielectric and metal layers (e.g., panels/panel layers) shown in FIG. 3 is merely an example. Some implementations may have less dielectric layers and/or metal layers. Some implementations may have more dielectric layers and/or metal layers. Different implementations may have different combinations of dielectric and metal layers (e.g., panels/panel layers).

In some implementations, the TVI 300 may be provided/manufactured by providing a first layer (e.g., layer 302) and then providing a first metal layer (e.g., metal layer 303) on top of the first layer. In some implementations, providing the first metal layer may include depositing, etching, and/or plating a metal layer (e.g., copper) on top of the first layer (e.g., dielectric). For example, providing the first metal layer may include manufacturing traces on the dielectric layer using known manufacturing processes (e.g., depositing, etching, plating) to a person of ordinary skill in the art. The process may be repeated until the number of desired layers (e.g., dielectric and/or metal) is achieved. In some implementations, a number of panels/panel layers are provided/manufactured. Panels/panel layers can be stacked on top of each other until a desired number of panels/panel layers is achieved. In some implementations, the panels/panel layers are heated/cured to form a laminate structure/laminated structure (e.g., TVI). In some implementations, the heating/curing of the panels/panel layers couple (e.g., bond) the panels/panel layers together. In the example of FIG. 3, the panels/panel layers are stacked on top of each other such that the traces are positioned on top of each other. However, in some implementations, the panels/panel layers may be stacked on top of each other such that traces on different layers may be offset (e.g., not aligned, not on top of each other) from each other. In some implementations, traces are as straight as possible, since turns in the traces may cause higher thermal resistance as well as poor power delivery.

The TVI 300 may also include solder (not shown). In some implementations, the TVI 300 may include solder (not shown) at its end portions. This may be achieved by dipping the TVI 300 in solder. In some implementations, the solder allows the TVI to be coupled to a package substrate. In some implementations, the solder at the end portions of the TVI allow the TVI to couple to other components of a package structure. For example, the solder may enable the coupling of the TVI to a package substrate and/or interposer in a package structure.

Having described the components and the structure of a through via insert (TVI), a sequence for manufacturing an exemplary TVI will now be described below.

Exemplary Sequence for Providing/Manufacturing a Through Via Insert (TVI)

Figure 4A:
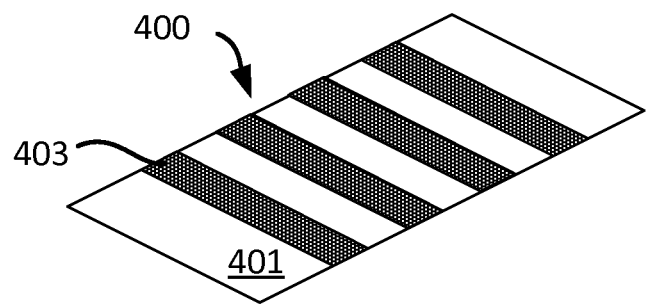
FIGS. 4A-4B illustrate a sequence for manufacturing a through via insert (TSV).
Figure 4A:
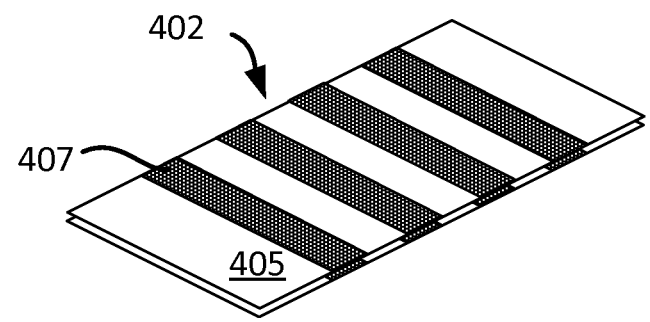
Figure 4A:
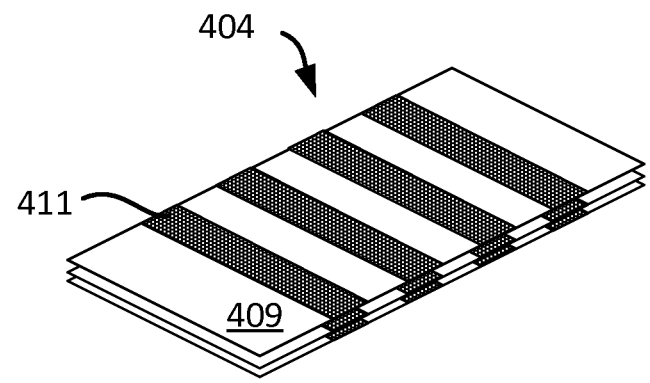
Figure 4B:
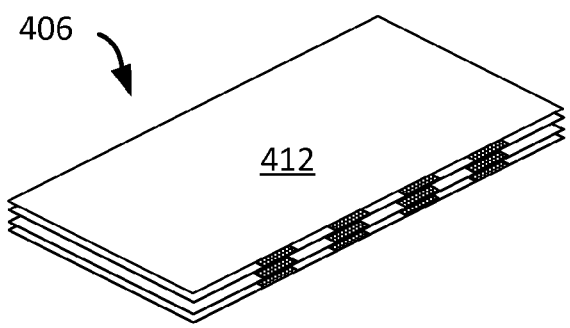
Figure 4B:
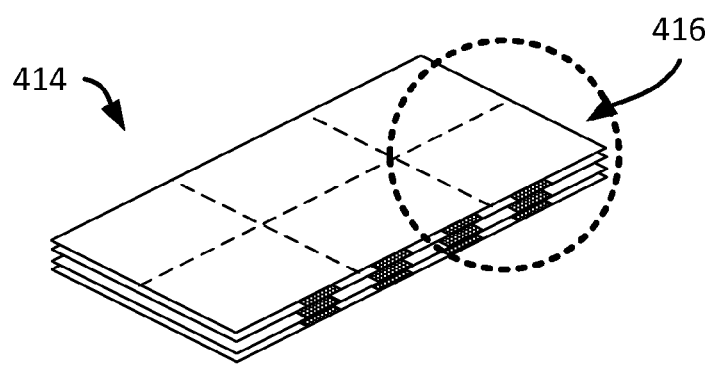
Figure 4B:
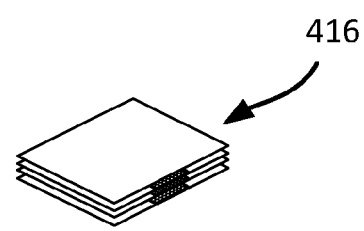

FIGS. 4A-4B illustrates an exemplary sequence for providing/manufacturing a through via insert (TVI). The exemplary sequence of FIGS. 4A-4B may be used to provide/manufacture any TVI described in the present disclosure.

As shown in FIG. 4A, the sequence starts at stage 1 with a first panel 400 that includes a dielectric layer 401 and several traces 403 (e.g., metal layer). The first panel 400 may be manufactured by providing a dielectric layer 401 and then providing traces 403 on the dielectric layer. In some implementations, providing the traces 403 may include manufacturing traces on the dielectric layer 401 using known manufacturing processes (e.g., depositing, etching, plating) to a person of ordinary skill in the art.

At stage 2, a second panel 402 is coupled to the first panel 400. The second panel 402 includes a dielectric layer 405 and traces 407. In this example, the second panel 402 is positioned above the first panel 400. However, in some implementations, the second panel 402 may be positioned below the first panel 400. The second panel 402 may be provided/manufactured using known manufacturing processes (e.g., depositing, etching, plating) to a person of ordinary skill in the art.

At stage 3, a third panel 404 is coupled to the second panel 402. The third panel 404 includes a dielectric layer 409 and traces 411. In this example, the third panel 404 is positioned above the second panel 402. However, in some implementations, the third panel 402 may be positioned below the first panel 400. The third panel 404 may be provided/manufactured using known manufacturing processes (e.g., depositing, etching, plating) to a person of ordinary skill in the art.

At stage 4, a fourth panel 406 is coupled to the third panel 404. The fourth panel 406 includes a dielectric layer 412. In this example, the fourth panel 404 is positioned above the third panel 404. In some implementations, once all the panels 400, 402, 404 and 406 are coupled together, the panels are cured (e.g., by heating) to form a laminate structure 414.

At stage 5, the laminate structure 414 is cut (e.g., diced) into smaller pieces (e.g., singular laminate structure). Different implementations may use different techniques to cut the laminate structure 414. For example, a laser and/or saw may be used to cut the laminate structure 414 into a singular laminate structure.

At stage 6, a piece 416 (e.g., singular laminate structure) of the laminate structure 414 has been cut. In some implementations, the piece 416 is a TVI (e.g., TVI 208, TVI 210, TVI 300) that is used in a package structure. Although not shown, the piece 416 (e.g., singular laminate structure, TVI) may be dipped in solder in some implementations. In some implementations, the solder is provided to the TVI after the TVI lamination (e.g., after laminate structure is provided).

In the example of FIGS. 4A-4B, the panels/panel layers are stacked on top of each other such that the traces are positioned on top of each other. However, in some implementations, the panels/panel layers may be stacked on top of each other such that traces on different layers may be offset (e.g., not aligned, not on top of each other) from each other. In some implementations, traces are as straight as possible, since turns in the traces may cause higher thermal resistance as well as poor power delivery.

Having described a structure and sequence for providing a through via insert (TVI), a method for manufacturing/providing a TVI will now be described below.

Exemplary Method for Providing/Manufacturing a Through Via Insert (TVI)

Figure 5:
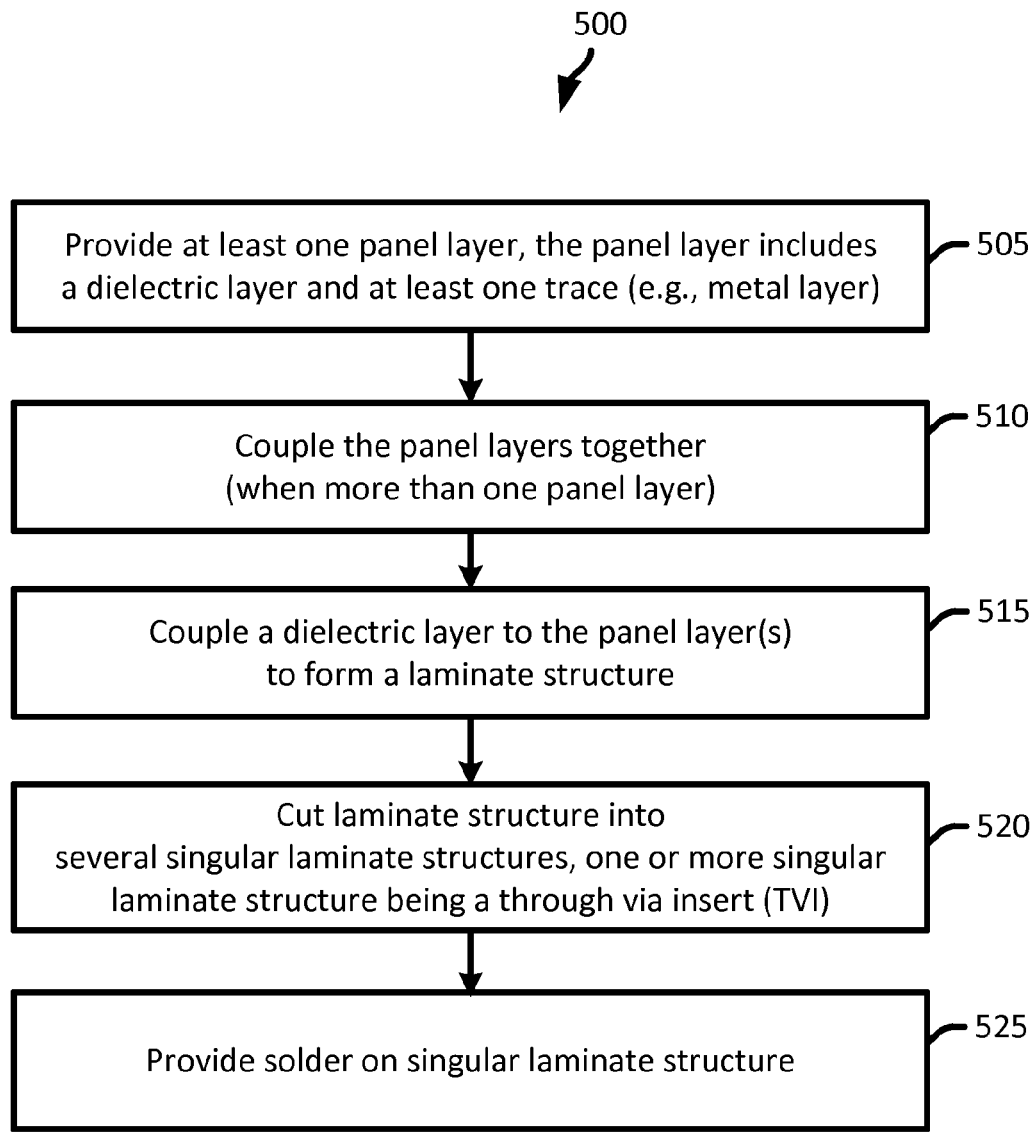
FIG. 5 illustrates a flow diagram of a method for manufacturing a through via insert (TVI).

FIG. 5 illustrates a flow diagram of method for providing/manufacturing a through via insert (TVI). The exemplary method of FIG. 5 may be used to provide/manufacture any TVI described in the present disclosure.

The method provides (at 505) at least one panel layer that includes a dielectric layer and at least one trace. In some implementations, the panel layer may be manufactured by providing a dielectric layer 401 and then providing traces (e.g., metal layer) on the dielectric layer. In some implementations, providing the traces may include manufacturing traces on the dielectric layer using known manufacturing processes (e.g., depositing, etching, plating) to a person of ordinary skill in the art.

The method couples (at 510) the panel layers together (when there is more than one panel layer). Stages 1-4 of FIGS. 4A-4B illustrate an example of panel/panel layers coupled together. The method couples (at 515) a dielectric layer to the panel layer(s) to form a laminate structure. Once the laminate structure is formed, the laminate structure is cured (e.g., heated) to form a permanent laminate structure.

The method then cuts (at 520) the laminate structure into several smaller pieces (e.g., singular laminate structure). In some implementations, one or more of these singular laminate structure may be a through via insert (TVI). For example, one or more of these singular laminate structures may be one or more of the TVI of FIGS. 2-3 (e.g., TVIs 208, 210, 300). Different implementations may use different techniques to cut the laminate structure. For example, a laser and/or saw may be used to cut (e.g., dice) the laminate structure into several singular laminate structures.

Once the laminate structure is cut (at 520), the method provides (at 525) solder on the singular laminate structure (e.g., TVI). In some implementations, providing the solder includes dipping the singular laminate structure (e.g., TVI) in solder. In some implementations, solder is provided on the end portions (e.g., bottom portion, top portion) of the singular laminate structure (e.g., TVI). In some implementations, the solder may be provided on the laminate structure before the laminate structure is cut.

Having described a method for providing a through via insert (TVI), a sequence for providing a package structure with through via inserts (TVIs) will now be described below.

Exemplary Sequence for Providing/Manufacturing a Package Structure With Through Via Inserts (TVIs)

Figure 6A:
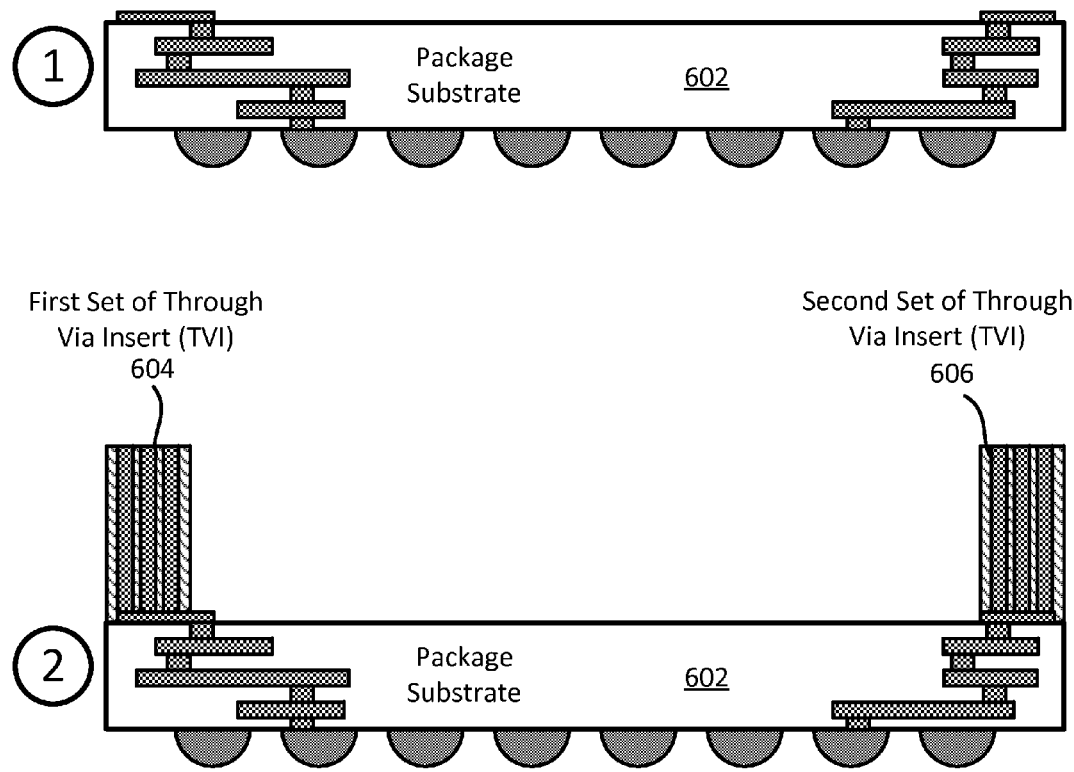
FIGS. 6A-6C illustrate a sequence for manufacturing a package structure that includes through via inserts (TVIs).
Figure 6B:
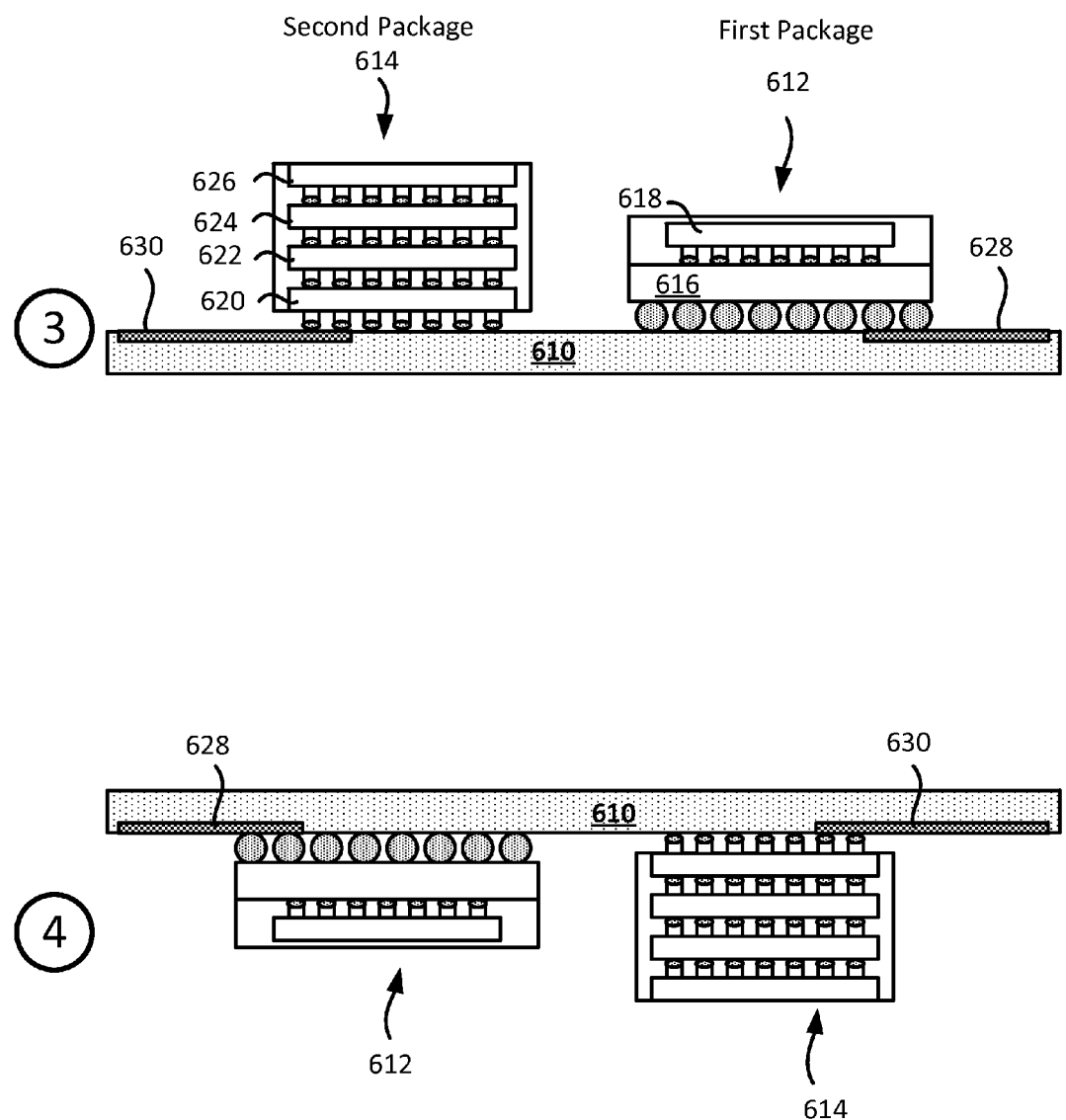
Figure 6C:
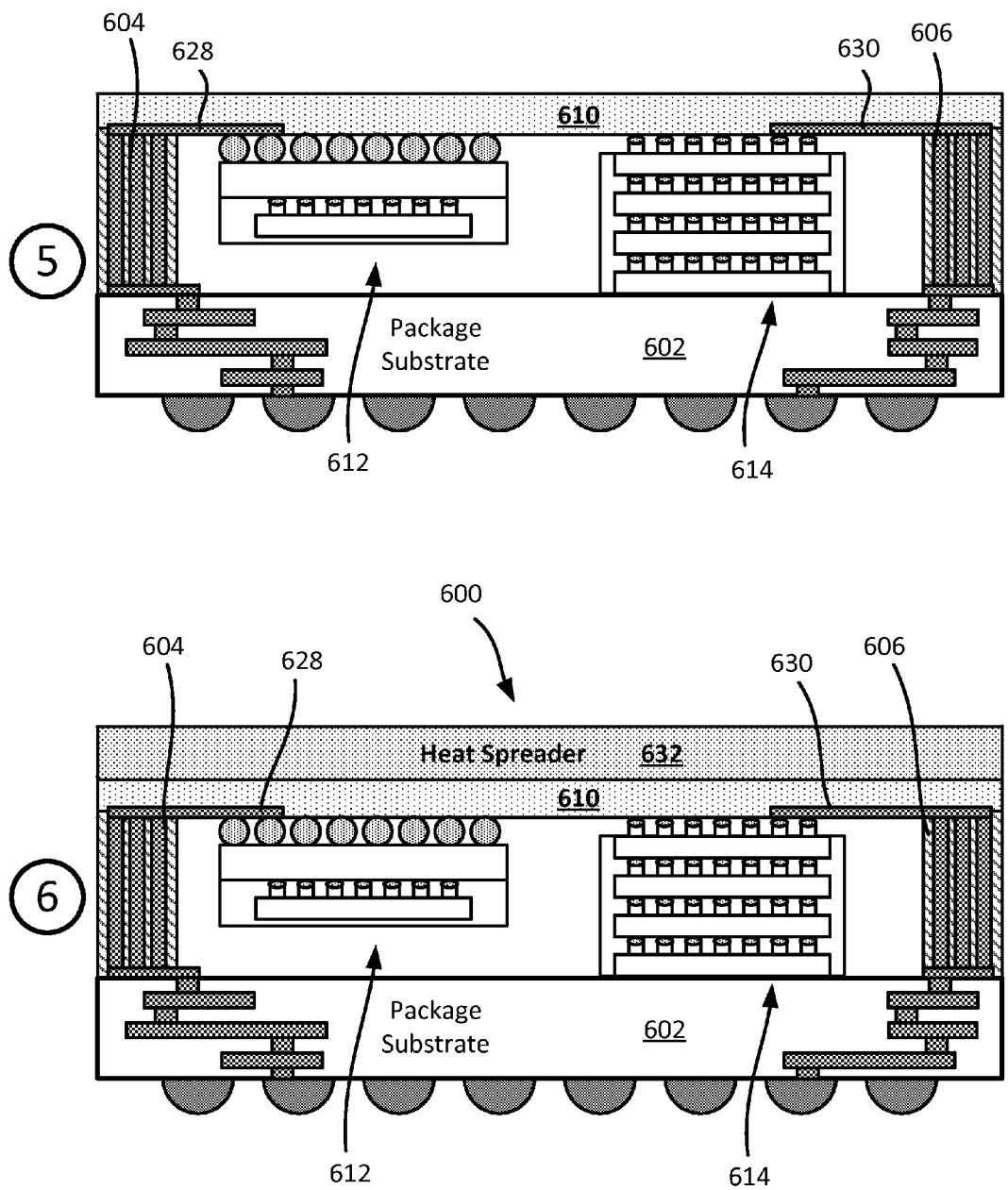

FIGS. 6A-6C illustrate a sequence for providing/manufacturing a package structure through via inserts (TVIs). The exemplary sequence of FIGS. 6A-6C may be applied any package structure described in the disclosure.

As shown in FIG. 6A, the sequence starts at stage 1 with a package substrate 602. The package substrate 602 may include traces and vias. These traces and vias provide an electrical path for power and signal lines. At stage 2, a first set of through via insert (TVI) 604 and a second set of through via insert (TVI) 606 are coupled to the package substrate 602. In some implementations, the first set of TVI 604 is coupled to the package substrate 602 through solder (not shown). Similarly, in some implementations, the second set of TVI 606 is coupled to the package substrate 602 through solder (not shown). In some implementations, the first set of TVI 604 and the second set of TVI 606 are manufactured using the method/sequence described in FIGS. 4A-4B.

As shown at stage 3 of FIG. 6B, a first package 612 and a second package 614 are coupled to an interposer 610. The interposer 610 includes a first set of traces 628 and a second set of traces 630. In some implementations, the interposer 610 includes a material with a high thermal conductivity value (e.g., metal). For example, the traces 628-630 may be made of copper in some implementations. The first package 612 may be a System-in-Package (SiP). The first package 612 is coupled to the first set of traces 628. The first package 612 includes a first die 616 and a second die 618. The second package 614 may be a System-in-Package (SiP). The second package 614 is coupled to the second set of traces 630. The second package 614 includes a third die 620, a fourth die 622, a fifth die 624, and a sixth die 626. In some implementations, the combination/arrangement of the interposer 610, the first package 612, and the second package 614 may be referred to as a multi-chip module (MCM). At stage 4, the coupled interposer 610, the first package 612 and the second package 614 is flipped. Since the combination/arrangement of the interposer 610, the first package 612 and the second package 614 may be referred as a multi-chip module (MCM), stage 4 may illustrate a flipped/inverted multi-chip module (MCM) in some implementations.

As shown at stage 5 of FIG. 6C, the flipped coupled interposer 610, the first package 612 and the second package 614 are coupled to the package substrate 602, the first set of TVI 604 and the second set of TVI 606. As further shown in stage 5, the first package 612 is inverted and coupled (e.g., electrically coupled) to the package substrate 602, through the first set of traces 628 and the first set of TVI 604. Similarly, the second package 614 is inverted and coupled (e.g., electrically coupled) to the package substrate 602, through the second set of traces 630 and the second set of TVI 606.

At stage 6, a heat spreader 632 is coupled to the interposer 610. In some implementations, a bonding material (not shown) may be used to bond the heat spreader 632 to the interposer 610. In some implementations, the heat spreader 632 may be coupled to the interposer 610 before the interposer 610, the TVI 604-606 are coupled to the package substrate 602.

In the design/configuration shown in stage 6 of FIG. 6C, the first package 612 is electrically coupled to the package substrate 602 through the first set of traces 628 and the first set of TVI 604. That is, power and signal lines traverse between the first package 612 and the package substrate 602 through the first set of TVI 604 and the first set of traces 628. Thus, one advantage of using the TVI 604 is that the TVI 604 provides at least two important functionalities/capabilities. One, the TVI 604 may be configured to provide heat dissipation functionality for the first package 612. Two, the TVI 604 may be configured to provide electrical coupling and/or electrical path functionality (e.g., for power and/or signal lines) between the first package 612 and the package substrate 602 (e.g., through traces, interconnects, vias in the package substrate 602). In some implementations, the heat dissipation functionality of the TVI 604 allows the first package 612 to operate at a lower temperature, which may subsequently result in better operational performance of the first package 612.

Similarly, the second set of TVI 606 is coupled to the second set of traces 630, which is coupled to the second package 614. In some implementations, the second set of TVI 606 is coupled to the second set of traces 630 through solder (which is not shown). The second package 614 is electrically coupled to the package substrate 602 through the second set of traces 630 and the second set of TVI 606. That is, power and signal lines traverse between the second package 614 and the package substrate 602 through the second set of TVI 606 and the second set of traces 630. Thus, just like the first set of TVI 604, one advantage of using one or more TVI with the second package 614 is that it provides at least two important functionalities/capabilities. One, the TVI 606 may be configured to provide heat dissipation functionality for the second package 614. Two, the TVI 606 may be configured to provide electrical coupling and/or electrical path functionality (e.g., for power and/or signal lines) between the second package 614 and the package substrate 602 (e.g., through traces, interconnects, vias in the package substrate 602). In some implementations, the heat dissipation functionality of the TVI 606 allows the second package 614 to operate at a lower temperature, which may subsequently result in better operational performance of the second package 614.

One benefit of the package structure design and configuration shown in stage 6 of FIG. 6C is that it eliminates the need for a filler in the package structure. As shown at stage 6 of FIG. 6C, even though the first package 612 is shorter than the second package 602, a filler is not necessary. Although in some implementations, a filler may be added nonetheless to the first package 612 to provide additional structural support of the first package 612 in the package structure 600. Similarly, a filler may also be added to the second package 614 to provide additional structural support of the second package 614 in the package structure 260. An example of packages with filler in a package structure using TVI is further described below in FIG. 7.

Figure 7:
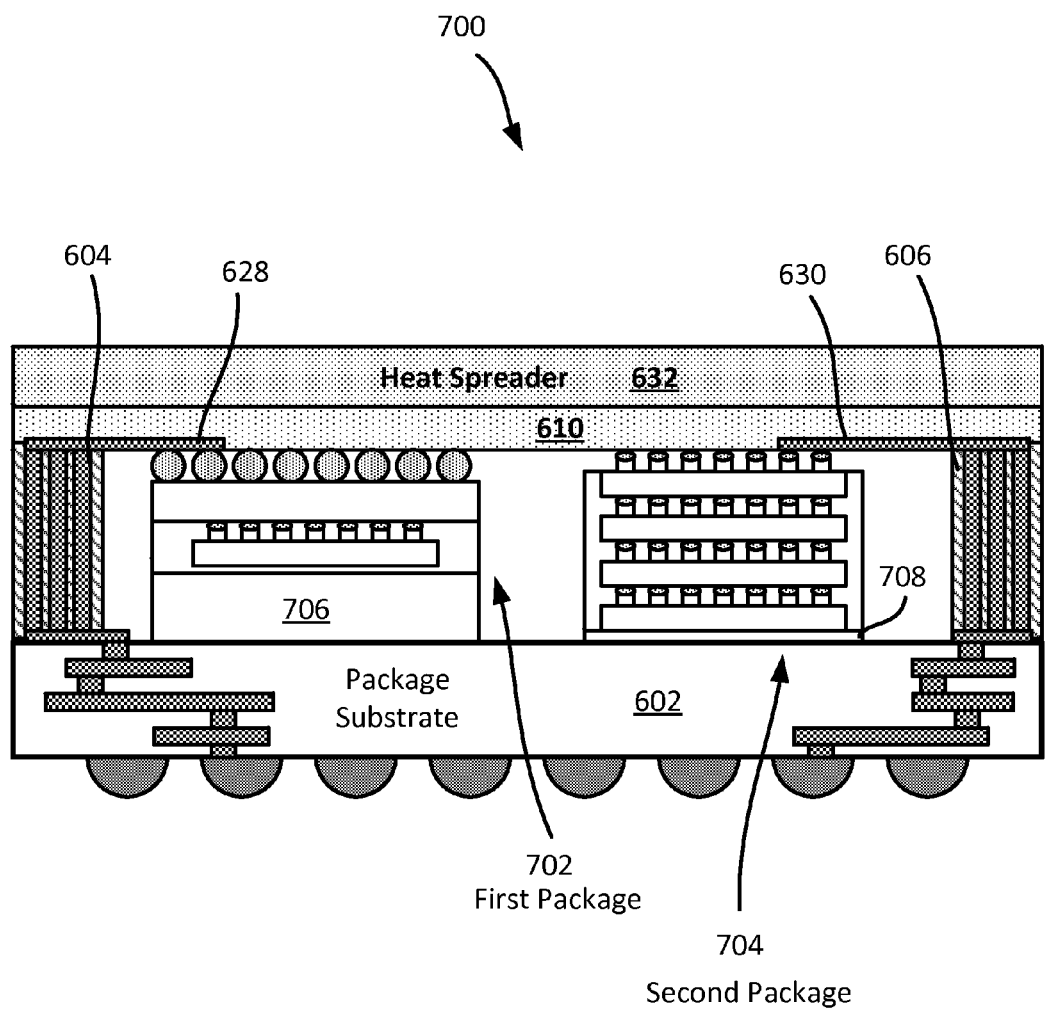
FIG. 7 illustrates another package structure with a through via insert (TVI).

Exemplary Package Structure With Through Via Inserts (TVIs) and Packages with Filler FIG. 7 illustrates an exemplary package structure that includes packages with filler. Specifically, FIG. 7 illustrates a package structure 700 that is similar to the package structure 600 shown at stage 6 of FIG. 6C, except that the package structure 700 includes packages with filler. As shown in FIG. 7, the package structure 700 includes a package substrate 602, a first set of through via insert (TVI) 604, a second set of through via (TVI) 606, an interposer 610, a first set of traces 628, a second set of traces 630 and a heat spreader 632. The package structure 700 also includes a first package 702 and a second package 704. The first package 702 includes a first filler 706. The second package 704 includes a second filler 708. In some implementations, the first filler 706 and the second filler 708 even out the height of the first and second packages 702-704 in the package structure 700. In addition, the first filler 706 and the second filler 708 may provide structural stability for the first and second packages 702-704. Moreover, the first filler 706 and the second filler 708 may also provide a path for heat to dissipate from the first package 702 and the second package 704. In some implementations, the filler (e.g., fillers 706, 708) may be a high thermal conductive die attach film/paste, such as aluminum oxide, boron nitride, silver, carbon nanotubes, or combination thereof.

Exemplary Method for Providing/Manufacturing a Package Structure With Through Via Inserts (TVIs)

Figure 8:
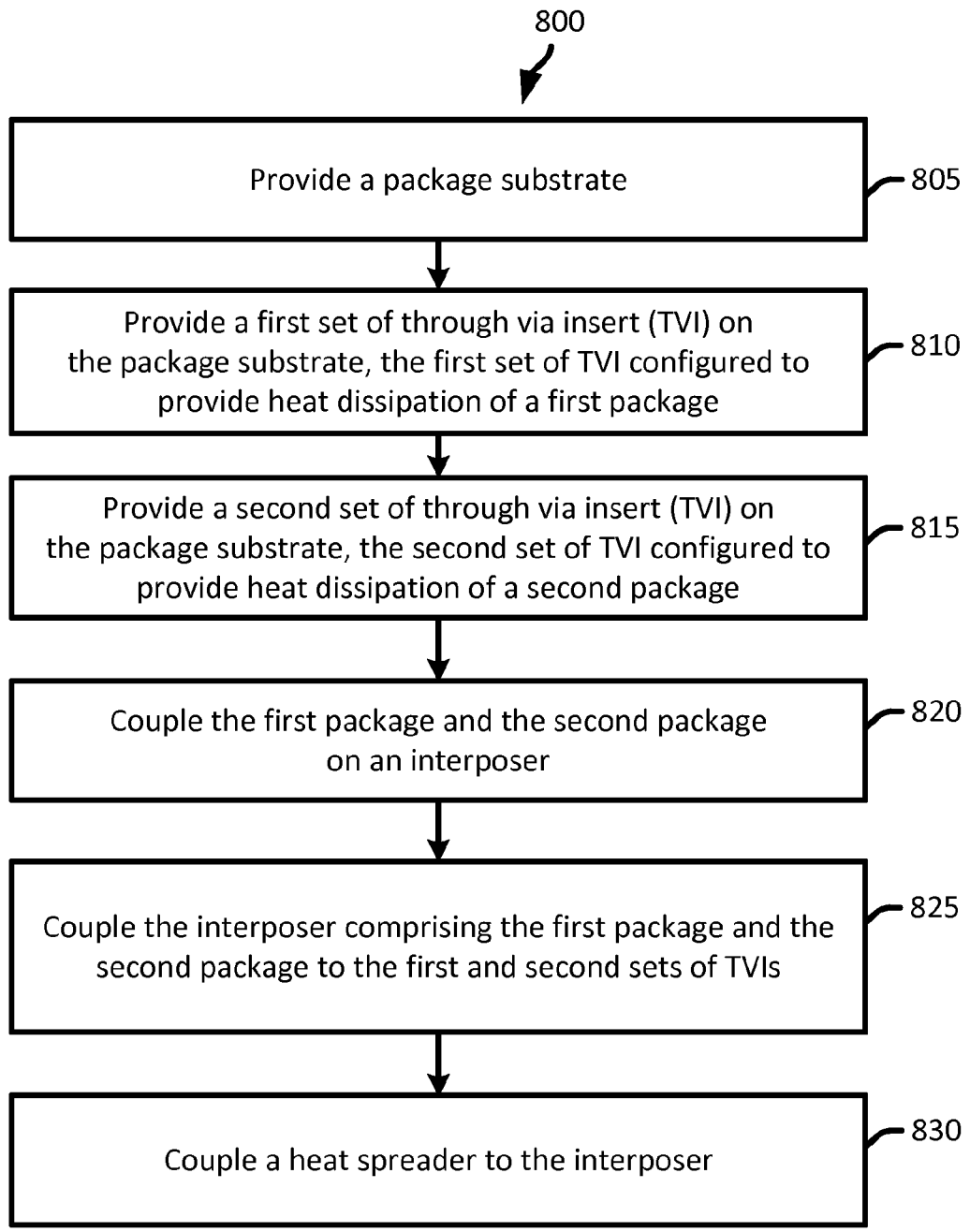
FIG. 8 illustrates a flow diagram of a method for manufacturing a package structure that includes through via inserts (TVIs).

FIG. 8 illustrates a flow diagram of a method for providing/manufacturing a package structure through via inserts (TVIs). The exemplary method of FIG. 8 will be described with reference FIGS. 6A-6C. However, it should be noted that the method may be applied to any package structure described in the disclosure.

The method provides (at 805) a package substrate. The package substrate may include traces, interconnect, and/or vias. These traces, interconnects and vias provide an electrical path for power and signal lines in the package substrate. Stage 1 of FIG. 6A illustrates an example of providing a package substrate in some implementations.

The method provides (at 810) a first set of through via insert (TVI) on the package substrate. The first set of TVI is configured to provide heat dissipation of a first package in some implementations. The first set of TVI is further configured to provide an electrical path (e.g., power and/or signal lines) between the first package and the package substrate in some implementations. FIGS. 4A-4B illustrates an example of a sequence for manufacturing/providing a TVI. Stage 2 of FIG. 6A illustrates an example of providing a first set of through via insert (TVI). As shown in stage 2, the first set of through via insert (TVI) 604 is coupled to the package substrate 602.

The method then provides (at 815) a second set of through via insert (TVI) on the package substrate. The second set of TVI is configured to provide heat dissipation of a second package in some implementations. The second set of TVI is further configured to provide an electrical path (e.g., power and/or signal lines) between the second package and the package substrate in some implementations. FIGS. 4A-4B illustrates an example of a sequence for manufacturing/providing a TVI. Stage 2 of FIG. 6A illustrates an example of providing a first set of through via insert (TVI). As shown in stage 2, the second set of through via insert (TVI) 606 is coupled to the package substrate 602.

The method further couples (at 820) the first package and the second package to an interposer. Stage 3 of FIG. 6B illustrates an example of a first package and a second package coupled to an interposer. As shown in stage 3, the first package 612 is coupled to the interposer 610. Similarly, the second package 614 is coupled to the interposer 610. The interposer may include a set of traces (e.g., a first set of traces 628 and a second set of traces 630). The interposer includes a material with a high thermal conductivity value (e.g., traces may be a metal). The first package and/or second package may be a System-in-Package (SiP). Each of the first and second packages may include one or more dies.

The method then couples (at 825) the interposer (which is coupled to the first package and the second package) to the first and second set of TVIs. In some implementations, coupling (at 825) the interposer to the first and second set of TVIs includes flipping the interposer. Since the combination/arrangement of an interposer, a first package and a second package may be referred as a multi-chip module (MCM), coupling (at 825) may include flipping/inverting a multi-chip module (MCM) in some implementations. Stage 4 of FIG. 6B illustrates an example of an interposer 610 that is coupled to a first package 612 and a second package 614 after a flip (e.g., flipped MCM). Stage 5 of FIG. 6C illustrates the flipped coupled interposer 610, the first package 612 and the second package 614 (e.g., flipped MCM) coupled to the package substrate 602, the first set of TVI 604 and the second set of TVI 606. As further shown in stage 5, the first package 612 is inverted and coupled to the package substrate 602, through the first set of traces 628 and the first set of TVI 604. Similarly, the second package 614 is inverted and coupled to the package substrate 602, through the second set of traces 630 and the second set of TVI 606. In some implementations, solder (not shown) is used to couple the interposer 610 to the first and second set of TVIs 604-606. More specifically, solder (not shown) is used to couple the first set of traces 628 of the interposer 610 to the first set of TVI 604. Similarly, solder (not shown) is used to couple the second set traces 630 of the interposer 610 to the second set of TVI 606.

The method couples (at 830) a heat spreader to the interposer. A bonding material may be used to couple the heat spreader to the interposer. Stage 6 of FIG. 6C illustrates an example of a heat spreader 632 coupled to the interposer 610. In some implementations, the coupling of the heat spreader to the interposer may be performed before the interposer is coupled to a package substrate.

Exemplary Electronic Devices

Figure 9:
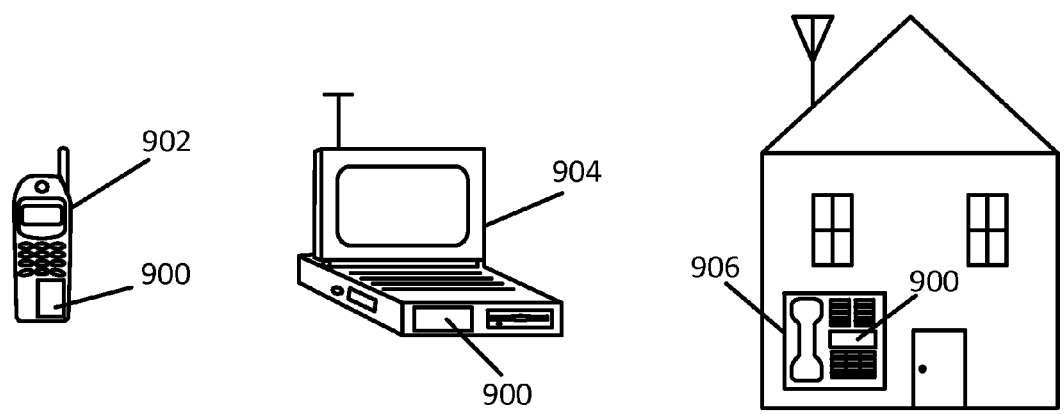
FIG. 9 illustrates various electronic devices that may be integrated with any of the aforementioned integrated circuit, die or package.

FIG. 9 illustrates various electronic devices that may be integrated with any of the aforementioned integrated circuit, die or package. For example, a mobile telephone 902, a laptop computer 904, and a fixed location terminal 906 may include an integrated circuit (IC) 900 as described herein. The IC 900 may be, for example, any of the integrated circuits, dice or packages described herein. The devices 902, 904, 906 illustrated in FIG. 9 are merely exemplary. Other electronic devices may also feature the IC 900 including, but not limited to, mobile devices, hand-held personal communication systems (PCS) units, portable data units such as personal digital assistants, GPS enabled devices, navigation devices, set top boxes, music players, video players, entertainment units, fixed location data units such as meter reading equipment, communications device, smartphones, tablet computers or any other device that stores or retrieves data or computer instructions, or any combination thereof.

One or more of the components, steps, features, and/or functions illustrated in FIGS. 2, 3, 4A-4B, 5, 6A-6C, 7, 8 and/or 9 may be rearranged and/or combined into a single component, step, feature or function or embodied in several components, steps, or functions. Additional elements, components, steps, and/or functions may also be added without departing from the invention.

One or more of the components, steps, features and/or functions illustrated in the FIGs may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the FIGs may be configured to perform one or more of the methods, features, or steps described in the FIGs. The novel algorithms described herein may also be efficiently implemented in software and/or embedded in hardware.

The word "exemplary" is used herein to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "coupled" is used herein to refer to the direct or indirect coupling between two objects. For example, if object A physically touches object B, and object B touches object C, then objects A and C may still be considered coupled to one another— even if they do not directly physically touch each other. The term "die package" is used to refer to an integrated circuit wafer that has been encapsulated or packaged or encapsulated. The term "set" is used to mean one or more. For example, the term "set of TVI" may mean "one or more TVIs."

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

Those of skill in the art would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing aspects of the disclosure are merely examples and are not to be construed as limiting the invention. The description of the aspects of the present disclosure is intended to be illustrative, and not to limit the scope of the claims. As such, the present teachings can be readily applied to other types of apparatuses and many alternatives, modifications, and variations will be apparent to those skilled in the art.

What is claimed is:

1. A semiconductor package structure comprising:
a package substrate;
a first package;
an interposer coupled to the first package;
a first set of through via insert (TVI) coupled to the interposer and the package substrate, the first set of TVI configured to provide heat dissipation from the first package;
a second package; and
a second set of through via insert (TVI) coupled to the interposer and the package substrate, the second set of TVI configured to provide heat dissipation from the second package, wherein the interposer comprises a first set of traces and a second set of traces, the first set of traces coupled to the first package and the first set of TVI, the second set of traces coupled to the second package and the second set of TVI.

2. The semiconductor package structure of claim 1 further comprising a heat spreader coupled to the interposer, the heat spreader configured to dissipate heat from the first package.

3. The semiconductor package structure of claim 1, wherein the first set of TVI is further configured to provide an electrical path between the first package and the package substrate.

4. The semiconductor package structure of claim 1, wherein the first package is electrically coupled to the package substrate through the interposer and the first set of TVI.

5. The semiconductor package structure of claim 1, wherein the first set of TVI comprises a first dielectric layer and a first metal layer.

6. The semiconductor package structure of claim 5, wherein the first set of TVI is a laminate structure.

7. The semiconductor package structure of claim 1, wherein the second set of TVI is further configured to provide an electrical path between the second package and the package substrate.

8. The semiconductor package structure of claim 1, wherein the semiconductor package structure is incorporated into at least one of a music player, a video player, an entertainment unit, a navigation device, a communications device, a mobile phone, a smartphone, a personal digital assistant, a fixed location terminal, a tablet computer, and/or a laptop computer.

9. The apparatus of claim 1, wherein the first set of TVI is located between the interposer and the package substrate.

10. An apparatus comprising:
a package substrate;
a first package;
an interposer coupled to the first package;
a first interconnect means for coupling the interposer and the package substrate, the first interconnect means configured to provide heat dissipation from the first package;
a second package; and
a second interconnect means for coupling the interposer and the package substrate, the second interconnect means configured to provide heat dissipation from the second package, wherein the interposer comprises a first set of traces and a second set of traces, the first set of traces coupled to the first package and the first interconnect means, the second set of traces coupled to the second package and the second interconnect means.

11. The apparatus of claim 10 further comprising a heat dissipating means configured to dissipate heat from the first package, the heat dissipating means coupled to the first interconnect means.

12. The apparatus of claim 10, wherein the first interconnect means is further configured to provide an electrical path between the first package and the package substrate.

13. The apparatus of claim 10, wherein the first package is electrically coupled to the package substrate through the interposer and the first interconnect means.

14. The apparatus of claim 10, wherein the first interconnect means comprises a first dielectric layer and a first metal layer.

15. The apparatus of claim 14, wherein the first interconnect means is a laminate structure.

16. The apparatus of claim 10, wherein the second interconnect means is further configured to provide an electrical path between the second package and the package substrate.

17. The apparatus of claim 10, wherein the apparatus is incorporated into at least one of a music player, a video player, an entertainment unit, a navigation device, a communications device, a mobile phone, a smartphone, a personal digital assistant, a fixed location terminal, a tablet computer, and/or a laptop computer.

18. The apparatus of claim 10, wherein the first interconnect means is located between the interposer and the package substrate.

19. A method for providing a semiconductor package structure, comprising:
providing a package substrate;
providing a first set of through via insert (TVI) on the package substrate;
coupling a first package to an interposer;
coupling the interposer to the first set of TVI such that the first set of TVI is coupled to the interposer and the package substrate, the first set of TVI configured to provide heat dissipation from the first package;
providing a second set of through via insert (TVI) on the package substrate
coupling a second package to the interposer; and
coupling the interposer to the second set of TVI such that the second set of TVI is coupled to the interposer and the package substrate, the second set of TVI configured to provide heat dissipation from the second package, wherein coupling the interposer further comprises a first set of traces and a second set of traces, the first set of traces coupled to the first package and the first set of TVI, the second set of traces coupled to the second package and the second set of TVI.

20. The method of claim 19 further comprising coupling a heat spreader to the interposer, the heat spreader configured to dissipate heat from the first package.

21. The method of claim 19, wherein the first set of TVI is further configured to provide an electrical path between the first package and the package substrate.

22. The method of claim 19, wherein the first package is electrically coupled to the package substrate through the interposer and the first set of TVI.

23. The method of claim 19, wherein the first set of TVI comprises a first dielectric layer and a first metal layer.

24. The method of claim 23, wherein the first set of TVI is a laminate structure.

25. The method of claim 19, wherein the second set of TVI is further configured to provide an electrical path between the second package and the package substrate.

26. The method of claim 19, further comprising incorporating the semiconductor package structure into at least one of a music player, a video player, an entertainment unit, a navigation device, a communications device, a mobile phone, a smartphone, a personal digital assistant, a fixed location terminal, a tablet computer, and/or a laptop computer.

27. The method of claim 19, wherein the interposer is coupled to the first set of TVI such that the first set of TVI is located between the interposer and the package substrate.

* * * * *